United States Patent
Ram et al.

(10) Patent No.: US 12,143,076 B2
(45) Date of Patent: Nov. 12, 2024

(54) MULTI-PORT AMPLIFIER WITH BASEBAND PROCESSING

(71) Applicant: NSL COMM LTD, Airport City (IL)

(72) Inventors: Uzi Ram, Givat Ela (IL); David Mansour, Tel Aviv (IL)

(73) Assignee: NSL COMM LTD, Airport City (IL)

( * ) Notice: Subject to any disclaimer, the term of this patent is extended or adjusted under 35 U.S.C. 154(b) by 505 days.

(21) Appl. No.: 17/565,795

(22) Filed: Dec. 30, 2021

(65) Prior Publication Data
US 2022/0209727 A1    Jun. 30, 2022

Related U.S. Application Data

(60) Provisional application No. 63/131,868, filed on Dec. 30, 2020.

(51) Int. Cl.
| H03F 1/32 | (2006.01) |
| H03F 3/21 | (2006.01) |
| H03F 3/217 | (2006.01) |
| H03F 3/38 | (2006.01) |

(52) U.S. Cl.
CPC ........... H03F 3/211 (2013.01); H03F 3/2175 (2013.01); H03F 3/38 (2013.01)

(58) Field of Classification Search
CPC ....................................................... H03F 1/32
USPC ..................................... 330/126, 124 R, 295
See application file for complete search history.

(56) References Cited

U.S. PATENT DOCUMENTS

| 5,783,969 | A | 7/1998 | Luz |
| 5,834,972 | A | 11/1998 | Schiemenz et al. |
| 8,026,764 | B2 * | 9/2011 | Sorrells .................... H04B 1/04 330/126 |
| 8,548,093 | B2 * | 10/2013 | Sorrells ................ H03G 3/3042 375/377 |
| 9,484,860 | B2 * | 11/2016 | Jones .................... H03F 1/0211 |
| 2010/0156528 | A1 | 6/2010 | Couchman et al. |
| 2015/0256134 | A1 | 9/2015 | Arcidiacono et al. |
| 2017/0026006 | A1 | 1/2017 | Roukos et al. |

OTHER PUBLICATIONS

International Search Report for PCT Application No. PCT/IL2021/051559, mailed on Apr. 11, 2022.

* cited by examiner

*Primary Examiner* — Henry Choe
(74) *Attorney, Agent, or Firm* — PEARL COHEN ZEDEK LATZER BARATZ LLP

(57) ABSTRACT

Systems and methods of multiport amplifier (MPA) implementation system, including: at least one input matrix, including a plurality of complex modulators, wherein each complex modulator is configured to receive an input channel stream, a summation logic block, configured to sum the complex product of the plurality of complex modulators, and a dual Digital to Analog (DAC) converter, configured to receive summation digital complex output from the summation logic block, a plurality of RF modulators, wherein each RF modulator is configured to receive a dual analog output as baseband I/Q branches from a corresponding DAC converter, and a plurality of amplifiers, wherein each complex amplifier is configured to receive the output of a corresponding RF Modulator for amplification to an output RF matrix.

8 Claims, 2 Drawing Sheets

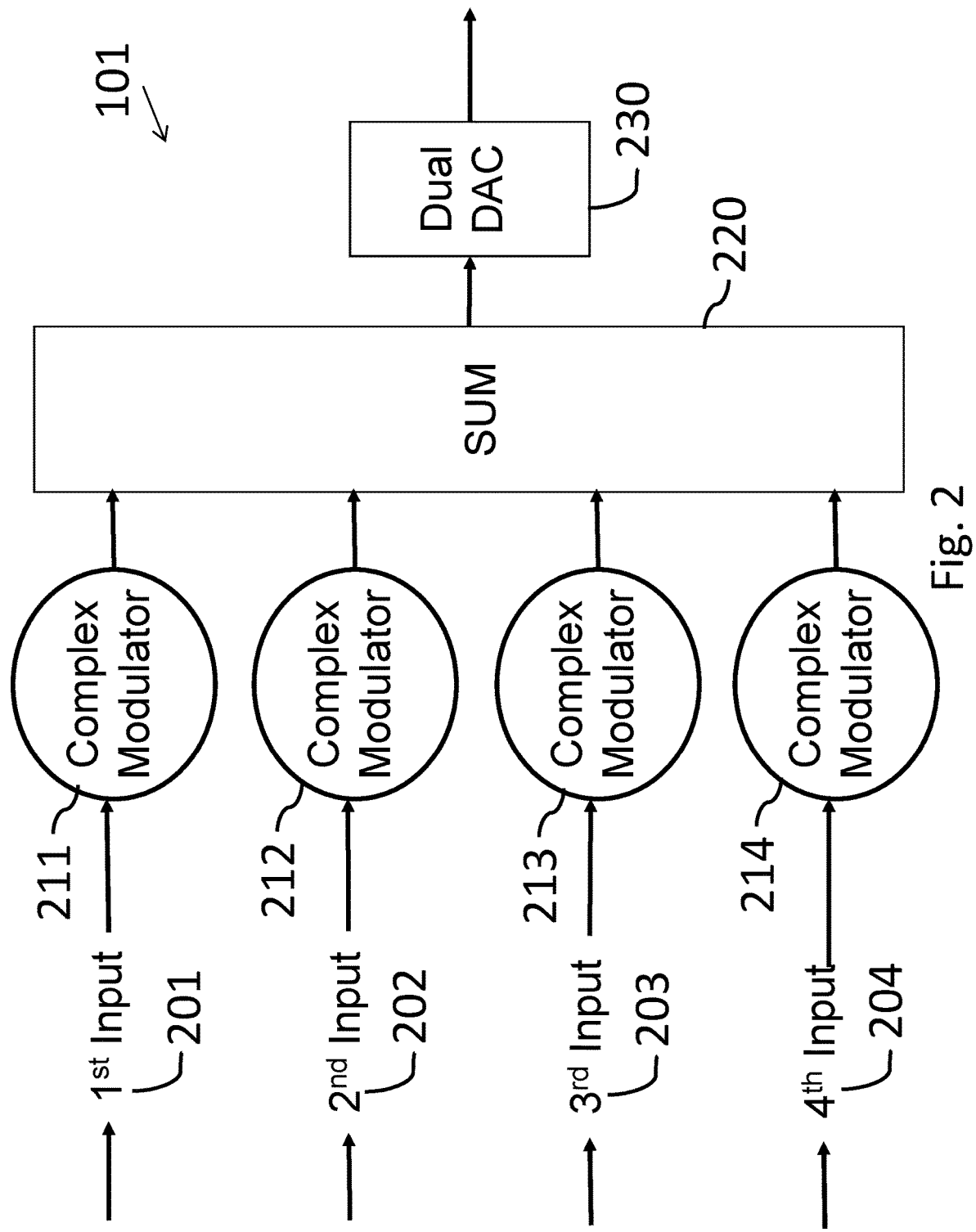

MULTI-PORT AMPLIFIER WITH BASEBAND PROCESSING

CROSS REFERENCE TO RELATED APPLICATIONS

This application claims priority to and the benefit of Provisional Application No. 63/131,868, filed Dec. 30, 2020, the entire contents of which are incorporate herein by reference in their entireties.

FIELD OF THE INVENTION

The present invention relates to communication links. More particularly, the present invention relates to systems and methods for multi-port amplifier with baseband processing.

BACKGROUND OF THE INVENTION

In communication links, multiple transmission channels can share multiple power amplifiers. These channels may use different power levels as desired, while the shared amplifiers can still operate at common power levels, in a method known as Multiport Amplifier (MPA).

Modern satellites may support communication via multiple beams. The coverage area on earth of these beams is often referred to as spots. The required transmission power towards different spots may depend on the number of users located within a spot, the distance between the spot-center to the satellite, and the weather conditions (e.g., rain) over that spot. The traditional design of satellites used a power amplifier per each spot beam, connecting amplifiers directly into antenna's transmission feed. The spots which are not in use or require low transmission power effects the total traffic throughput, as maximal data throughput is achieved when maximal transmission power is used. The MPA method is used at more modern satellite designs, allowing to tailor the transmission power level per each spot, while still using all available transmission power from all amplifiers on the satellite. The application of MPAs allows efficient and flexible sharing of the total available power from the power amplifiers among the beams while meeting varying traffic conditions or variable link conditions.

The main elements of the MPA solution consists of a multiport input RF matrix, a bank of amplifiers, and an RF output matrix. The input and output RF matrix are known in the industry as "Butler Matrix". The Butler Matrix is usually composed of inter-connected two-port RF hybrid elements and delay-lines. Implementation typically use wave-guide elements or printed-circuitry, for implementing the Butler matrix.

The input MPA matrix provides the amplifiers with a linear combination of all inputs, with pre-designed phase shifts between any input to the amplifier's inputs. The number of channels is usually a power of 2, such as 8 or 16, although additional channels and switches may be used for a redundant configuration. The input power to all amplifiers is designed to be equal. Any input channel appears at all linear combination sums (amplifier's input), with equal gain (or loss) and with different phase shifts such as 0, 90, 180, or 270 degrees.

The output RF matrix is designed to be such that the combined operation of the input and output matrixes brings each input channel to a single corresponding channel output, and that channel is nulled at all other output channels. The nulling of signals at non-designated output ports is achieved by the summation of signal replicas at different phase shifts so that the total phasor vector sum is zero.

However, in any practical implementation, each channel includes some undesired leakages from the other channels, such that the overall signal to interference ratio may limit the overall communication performance and may decrease data throughput. The leakages are due to errors in the actual phase shifts of the Butler input and output matrixes, the variations of gain and phase-shift between the different amplifiers. In any realistic implementation of RF matrix and amplifiers, phase shifts and gain may vary in respect to the desired ideal gain and phase-shift values due to the dependency of gain and phase shift of the components on frequency, aging, temperature, imperfect realization of hybrids and amplifiers, impedance matching, and more.

SUMMARY

There is thus provided, in accordance with some embodiments of the invention, a multiport amplifier (MPA) implementation system, including: at least one input matrix, including: a plurality of complex modulators, wherein each complex modulator is configured to receive an input channel stream, a summation logic block, configured to sum the complex product of the plurality of complex modulators, a dual Digital to Analog (DAC) converter, configured to receive summation digital complex output from the summation logic block, a plurality of RF modulators, wherein each RF modulator is configured to receive a dual analog output as baseband I/Q branches from a corresponding DAC converter, and a plurality of amplifiers, wherein each complex amplifier is configured to receive the output of a corresponding RF Modulator for amplification to an output RF matrix.

In some embodiments, the plurality of RF modulators is phase-synchronous, using a single reference oscillator for the LO input of the plurality of RF modulators. In some embodiments, each RF modulator is further configured to: multiply the received 'I' branch by a COSINE waveform at the frequency of the Local Oscillator (LO) that is coupled to each RF Modulator, multiply the 'Q' branch by a SINE waveform at the same frequency as the COSINE waveform, and sum the result into a single RF modulated signal.

In some embodiments, the output RF matrix suppresses leakage of power from other channels into a designated channel. In some embodiments, the MPA implementation system is implemented in a satellite. In some embodiments, the MPA implementation system comprises four input matrix.

In some embodiments, the MPA implementation system comprises four complex modulators. In some embodiments, the MPA implementation system comprises four RF modulators. In some embodiments, the MPA implementation system comprises four amplifiers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 shows a first input matrix 101 of the system 100, according to embodiments of the invention.

Figure 1:
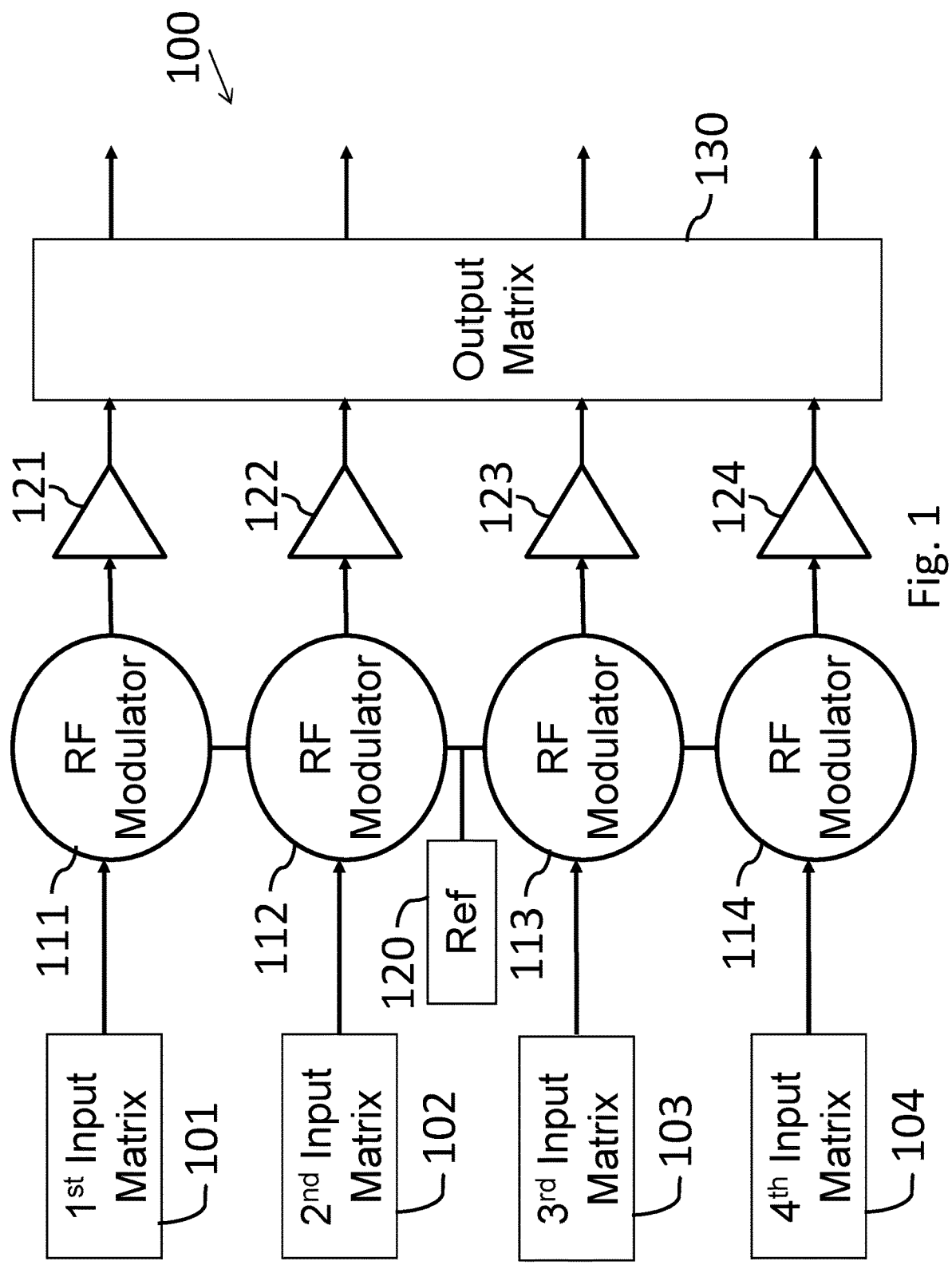
FIG. 1 is a schematic example describing 4 channel MPA implementation, with input matrix realization via digital baseband processing, according to embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to some embodiments, systems and methods are provided for a novel alternative for MPA implementation (hereinafter "improved MPA"—IMPA), such that undesired signal leakages may be suppressed. In addition, a reduction in weight and size of the complete IMPA solution is provided in some embodiments, which is of great importance in satellite design, effecting, for instance, satellite launch price.

According to some embodiments, the input RF matrix is replaced by performing equivalent linear combinations digitally, over the signal's samples at baseband, followed by Digital to Analog conversion, and synchronized up-conversion or I/Q modulation (converting baseband information into RF signals).

The phase shifts, as well as the linear combination sums, are performed in the complex digital domain. For instance, rotation of 90 degree at RF is equivalent to interchange of 'Q' (quadrature signal) with 'I' (in-phase signal), and 'I' with '−Q', rotation of 270 degrees involves replacing 'Q' with '−I', and 'I' with 'Q', and 180 degrees shift involves multiplying the complex samples by '−1'. The linear combinations are just summation of samples of different channels with appropriate phase rotation.

The linear combinations may be routed to dual-channel Digital to Analog converter, and the analog I/Q pair may enter IQ Modulators. All these modulators need to be locked on a common reference, so that the synthesized local oscillators will be at common frequency, phased-locked to the common reference. This method may limit shared amplifiers under the MPA construction to share the same frequency-band.

In large satellites with large number of beams this is a minor limitation, as small number of frequency bands is used, and the same frequency-band is repeated in many spots (that luminates dis-patched areas on Earth). Thus, if, for instance, a satellite will use 4 frequency-bands and, say, 64 spots, it may implement four MPA constructions, each serving 16 channels.

Replacing the input Butler matrix by digital processing has many advantages. One very important advantage is the ability to correct all phase and amplitude (gain) errors due to both the amplifiers, and to the output butler matrix. In some embodiments, correcting phase and amplitude errors in all the $N^2$ transfer elements of the output Butler matrix requires the ability to set all $N^2$ matrix elements of the input matrix.

If we denote the input matrix by 'A', the amplifiers bank by a (diagonal) matrix 'G' and the output matrix by 'B', and we require a total input-to-output transfer matrix without channel leakage, we therefore require:

$$A*G*B = g*I$$

where 'g' is some required gain, and 'I' is the unity matrix.

In some embodiments, if some inter-change of output ports is required, the 'I' matrix in the above equation may be replaced by a matrix with these column and rows interchanged.

Consequently, 'A' may be obtained by measuring the transfer matrix from amplifier's inputs to output, G*B, and computing the required input matrix 'A':

$$A = g*I*(G*B)^{-1}$$

The required resultant matrix, 'A', may easily be realized by just setting the matrix rows complex values as the complex multiplying factors of the linear combinations. This enables correcting the combined effect of the gain and phase-shift variations of the amplifiers and the phase and amplitude error of the output matrix. In addition to the ability to correct all amplifiers and output matrix inaccuracies and suppress leakages, the suggested application also saves weight and size of the input Butler matrix structure, that in previous solutions may be quite big and bulky especially at lower frequency bands.

Reference is made to FIG. 1, which shows a schematic system 100 depicting 4 channel MPA implementation, with input matrix realization via digital baseband processing, according to embodiments of the invention.

System 100 is an implementation example of a possible implementation of the IMPA according to embodiments of the invention. In system 100 the complex digital sample stream of 4 input channels may be processed by digital processing. In some embodiments, signals from an input matrix are modulated and amplified.

Reference is made to FIG. 2, which shows an input matrix 101 of the system 100, according to embodiments of the invention. For example, the input matrix 101 may receive four input channel streams 201, 202, 203, 204.

Each of the input channel streams 201, 202, 203, 204 may be routed to four complex modulators or multipliers 211, 212, 213, 214 respectively. A summation logic block 220 may sum the complex product of the four multipliers 211, 212, 213, 214.

The summation digital complex output may be passed to a dual Digital to Analog (DAC) converter 230. Each dual analog output, known as baseband I/Q branches, may be passed to a quadratic RF Modulator 111, 112, 113, 114 as shown in FIG. 1.

According to some embodiments, the structure of the first input matrix 101 (shown in FIG. 2) may be similar to the second input matrix 102, the third input matrix 103, and the fourth input matrix 104.

Reference is now made back to FIG. 1. The RF Modulators 111, 112, 113, 114 may multiply the received 'I' branch by a COSINE waveform, at the frequency of the Local Oscillator (LO) that is coupled to each RF Modulator 111, 112, 113, 114. In some embodiments, the RF Modulators 111, 112, 113, 114 may multiply the 'Q' branch by a SINE waveform at the same frequency as the COSINE waveform, and accordingly sum the two multipliers into a single RF modulated signal.

In some embodiments, the four RF Modulators 111, 112, 113, 114 may be phase-synchronous, and use a single reference oscillator or RF synthesizer 120 for the LO input of all four RF modulators.

The output of each RF Modulators 111, 112, 113, 114 may be passed to a corresponding amplifier 121, 122, 123, 124. The output of these amplifiers 121, 122, 123, 124 may be passed to the output RF Matrix 130.

The output matrix 130 may operate, in some embodiments, similarly to the previous solution of 4×4 MPA, using waveguide Hybrid elements with inter waveguide connections.

Embodiments of the invention may provide means to replace the RF input matrix of a known MPA design by performing equivalent linear combination of input channels in the complex baseband sample domain. This method provides means to suppress un-desired leakages between channels by simple change of parameters in a digital programable logic hardware, to allow operation over larger frequency bandwidth, and to save hardware weight and space.

Embodiments of the invention provide a construction of Improved Multiport Amplifier (IMPA), where the input RF matrix is replaced by algebraic operations in the baseband complex sample, followed by conversion to Analog, and I/Q Modulation.

In some embodiments, an IMPA algebraic operations are used to suppress the leakage power from other channels into a designated channel.

In some embodiments, an IMPA is implemented in a satellite.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A multiport amplifier (MPA) implementation system, comprising:
at least one input matrix, comprising:
a plurality of complex modulators, wherein each complex modulator is configured to receive an input channel stream and perform multiplication to produce a complex product;
a summation logic block, configured to sum the complex product of the plurality of complex modulators; and
a dual Digital to Analog (DAC) converter, configured to receive summation digital complex output from the summation logic block;
a plurality of phase-synchronous RF modulators wherein each RF modulator is configured to receive a dual analog output as baseband I/Q branches from a corresponding DAC converter using a single reference oscillator for the LO input of the plurality of RF modulators; and
a plurality of amplifiers, wherein each complex amplifier is configured to receive the output of a corresponding RF Modulator for amplification to an output RF matrix.

2. The system of claim 1, wherein each RF modulator is further configured to:
multiply the received 'I' branch by a COSINE waveform at the frequency of the Local Oscillator (LO) that is coupled to each RF Modulator;
multiply the 'Q' branch by a SINE waveform at the same frequency as the COSINE waveform; and
sum the result into a single RF modulated signal.

3. The system of claim 1, wherein the output RF matrix suppresses leakage of power from other channels into a designated channel.

4. The system of claim 1, wherein the MPA implementation system is implemented in a satellite.

5. The system of claim 1, wherein the MPA implementation system comprises four input matrix.

6. The system of claim 5, wherein the MPA implementation system comprises four complex modulators.

7. The system of claim 5, wherein the MPA implementation system comprises four RF modulators.

8. The system of claim 7, wherein the MPA implementation system comprises four amplifiers.

* * * * *